United States Patent
O'Brien (10) Patent No.: US 11,156,790 B2
(45) Date of Patent: Oct. 26, 2021

(54) FIBER-LESS PHOTONIC SYSTEM IN AN INTEGRATED PACKAGE

(71) Applicant: University College Cork, Cork (IE)

(72) Inventor: Peter O'Brien, Cork (IE)

(73) Assignee: University College Cork, Cork (IE)

(*) Notice: Subject to any disclaimer, the term of this patent is extended or adjusted under 35 U.S.C. 154(b) by 0 days.

(21) Appl. No.: 16/434,838

(22) Filed: Jun. 7, 2019

(65) Prior Publication Data

US 2019/0377142 A1 Dec. 12, 2019

Related U.S. Application Data

(60) Provisional application No. 62/682,034, filed on Jun. 7, 2018.

(51) Int. Cl.
*G02B 6/42* (2006.01)
*G02B 1/00* (2006.01)
*H05K 3/00* (2006.01)

(52) U.S. Cl.
CPC .......... *G02B 6/4239* (2013.01); *G02B 1/005* (2013.01); *H05K 3/0061* (2013.01)

(58) Field of Classification Search
CPC ......... G02B 6/4239; G02B 1/005; G02B 6/00
USPC ........................................................ 385/92
See application file for complete search history.

(56) References Cited

U.S. PATENT DOCUMENTS

| | | | | |
|---|---|---|---|---|
| 5,136,366 A | * | 8/1992 | Worp | H01L 23/3121 257/687 |
| 5,155,786 A | * | 10/1992 | Ecker | G02B 6/4202 257/713 |
| 5,493,437 A | * | 2/1996 | Lebby | G08B 5/228 398/139 |
| 5,917,976 A | * | 6/1999 | Yamaguchi | G02B 6/4249 385/88 |
| 6,219,470 B1 | * | 4/2001 | Tu | G02B 6/4204 385/14 |
| 7,533,457 B2 | * | 5/2009 | Foehringer | H01L 21/565 29/825 |
| 9,063,313 B1 | * | 6/2015 | Hasharoni | G02B 6/4249 |
| 9,644,234 B2 | * | 5/2017 | Pipper | H05B 3/0038 |
| 9,645,316 B1 | * | 5/2017 | Hasharoni | G02B 6/4246 |
| 2002/0097957 A1 | * | 7/2002 | Kikuchi | G02B 6/327 385/33 |
| 2003/0201462 A1 | * | 10/2003 | Pommer | G02B 6/4201 257/200 |
| 2004/0067015 A1 | * | 4/2004 | Nakajima | G02B 6/32 385/33 |
| 2005/0046016 A1 | * | 3/2005 | Gilleo | H01L 23/055 257/713 |
| 2005/0205771 A1 | * | 9/2005 | Sherrer | G02B 6/4292 250/239 |
| 2009/0140277 A1 | * | 6/2009 | Wang | H01L 33/58 257/98 |

(Continued)

*Primary Examiner* — Kaveh C Kianni
(74) *Attorney, Agent, or Firm* — ARC IP Law, PC; Joseph J. Mayo (57) ABSTRACT

The invention provides a photonic package system comprising at least two optical alignment pins integrated on a package substrate. A key feature of this invention is the addition of alignment structures within the package. When combined with the use of micro optics it enables a 'fiber-less' photonic package system that requires no physical connection between and optical fiber and the photonic package system.

12 Claims, 7 Drawing Sheets

(56) References Cited

U.S. PATENT DOCUMENTS

| | | | |
|---|---|---|---|
| 2010/0006784 A1* | 1/2010 | Mack | G02B 6/43 |
| | | | 250/551 |
| 2012/0012869 A1* | 1/2012 | Song | H01L 33/22 |
| | | | 257/91 |
| 2013/0077978 A1* | 3/2013 | Duis | H04B 10/40 |
| | | | 398/139 |
| 2013/0094864 A1* | 4/2013 | Duis | H04B 10/40 |
| | | | 398/139 |
| 2013/0182998 A1* | 7/2013 | Andry | G02B 6/4204 |
| | | | 385/33 |
| 2013/0207083 A1* | 8/2013 | Young | H01L 51/5246 |
| | | | 257/40 |
| 2013/0314707 A1* | 11/2013 | Shastri | G01B 11/14 |
| | | | 356/399 |
| 2014/0177995 A1* | 6/2014 | Mohammed | G02B 6/4214 |
| | | | 385/14 |
| 2016/0323203 A1* | 11/2016 | Mesh | H04L 49/30 |
| 2019/0036618 A1* | 1/2019 | Hasharoni | H04B 10/801 |
| 2019/0187162 A1* | 6/2019 | Shastry | G01N 21/648 |
| 2019/0384007 A1* | 12/2019 | Matiss | G02B 6/1221 |
| 2020/0028000 A1* | 1/2020 | Wang | H01L 31/1075 |

* cited by examiner

FIBER-LESS PHOTONIC SYSTEM IN AN INTEGRATED PACKAGE

The application claims the benefit of U.S. Provisional Patent Application No. 62/682,034, filed 7 Jun. 2018, the specification of which is hereby incorporated herein by reference.

BACKGROUND OF THE INVENTION

Field of the Invention

This disclosure relates to a photonic or optical device package.

Description of Related Art

There is a growing demand for new photonic components, driven by applications in emerging mass markets that have extremely high-volume requirements, typically millions of components per year. Applications include, high-speed communications for datacenters, sensors for automotive such as LIDAR, medical and point-of-care diagnostics, and the growth of the Internet of Things.

A major part of the photonic component cost is the package or housing which contains the photonic device and supports all necessary interconnects, including optical and electrical connections. Historically, photonic packages have been difficult to achieve due to the demanding requirements such as long-distance telecommunications, which have required the photonic device to be packaged in a hermetically sealed assembly, where optical fibers have been passed through the packaged and bonded directly to the device, enabling input and output optical connections.

A typical example of this type of package is the butterfly, consisting of a gold plated Kovar metal housing, with a Kovar lid welded to the top of the package, forming an internal hermetic environment. Two important factors make this type of photonic package unsuitable for mass market applications, where cost is a key driver. 1) The coat of materials is extremely high, and 2) The manufacturing processes, especially the fiber alignment and bonding process, are slow and expensive (fiber alignment and bonding is typically a device-by-device or serial process).

A solution addressing both these factors is required to enable a photonic package system suitable for mass market applications and the like.

BRIEF SUMMARY OF THE INVENTION

According to the invention there is provided, as set out in the appended claims, a photonic package system comprising:
  a substrate layer;
  at least two optical alignment pins integrated on the substrate layer and protruding in a vertical or horizontal or angled direction to the substrate layer;
  a photonic device positioned and aligned with respect to the two pins; and
  an optical device configured to receive an optical signal and aligned with respect to the two pins.

A key feature of the invention is the addition of alignment structures within the package. When combined with the use of a micro optic device it enables a 'fiber-less' photonic package system that requires no physical connection between and optical fiber and the photonic package system.

In one embodiment a silicone or soft polymer encapsulation material.

In one embodiment the photonic package system comprises a protective encapsulation material such that the optical device and pins are visible.

In one embodiment the optical device comprises at least one micro optical lens connected to the photonic device and configured with the function of expanding an optical beamwidth between the photonic device and an external separate optical fiber source.

In one embodiment the optical device comprises a micro optical lens.

In one embodiment the substrate comprises at least one of a metal, ceramic, silicon or organic PCB material.

In one embodiment there is provided a plastic overmoulding for hermetic encapsulation.

In one embodiment the photonic package system comprises an integrated heatsink.

In one embodiment the alignment pins protrude in a vertical position from the substrate layer.

In one embodiment the alignment pins protrude in a horizontal or angled position with respect to the substrate layer.

In one embodiment the separate optical fibre source comprises two female portions or slots dimensioned to receive the pins in use.

In one embodiment there is provided a photonic package comprising at least two optical alignment pins integrated on a package substrate In one embodiment the photonic package substrate comprises at least one of a metal, ceramic, silicon or organic PCB on which the optical alignment pins are integrated.

In one embodiment the photonic package comprises at least one micro lens connected to the photonic device with the function of expanding the optical beam between the photonic device and a separate optical fiber.

In one embodiment the photonic package format is compatible with surface mount assembly on printed circuit boards (eg. DIL, QFN and BGA).

In one embodiment the photonic package comprises plastic over-moulding for hermetic encapsulation.

In one embodiment the photonic package comprises silicone or soft polymer encapsulation for hermetic encapsulation.

In one embodiment the photonic package comprises silicone or soft polymer encapsulation adapted for extra heat dissipation.

In another embodiment there is provided a method of making a photonic package system comprising the steps of:
  providing a substrate layer;
  integrating at least two optical alignment pins on the substrate layer and protruding from the substrate layer;
  positioning a photonic device with respect to the two pins; and
  aligning an optical device and configured to receive an optical signal with respect to the two alignment pins.

In a further embodiment there is provided a photonic package system comprising:
  a substrate layer;
  at least one optical alignment pin integrated on the substrate layer and protruding from the substrate layer;
  a photonic device positioned and aligned with respect to the at least one pin; and
  an optical device configured to receive an optical signal and aligned with respect to the pin.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
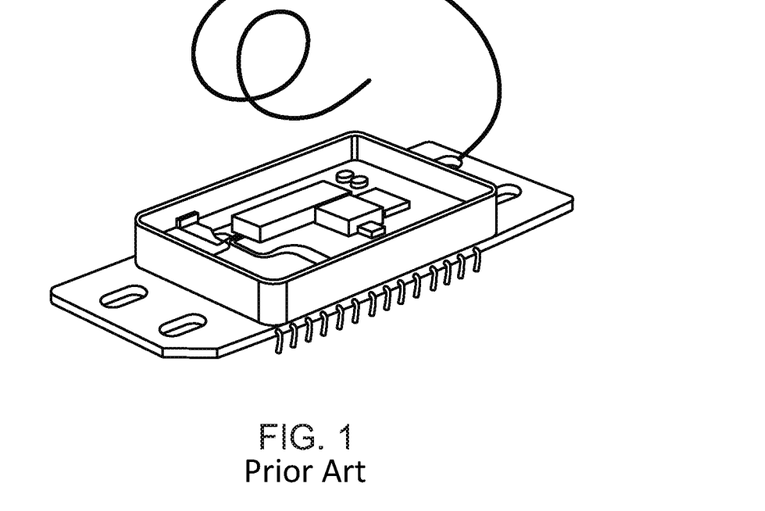
FIG. 1 illustrates a conventional photonic device that require costly materials and slow assembly processes, especially the optical fiber alignment and bonding process.
Figure 2A:
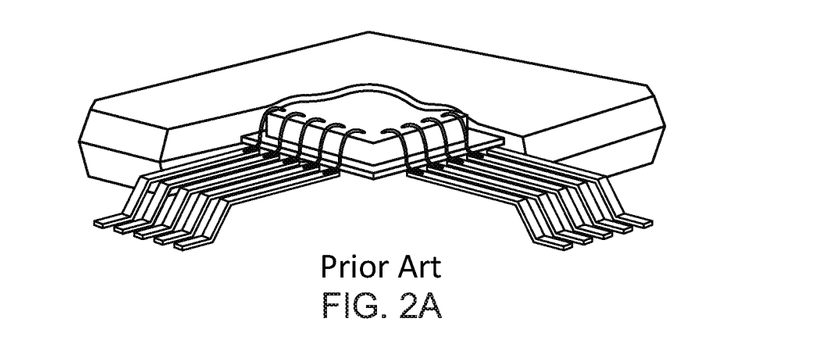
FIG. 2a illustrates a cross-section of electronic IC package showing how silicon IC is bonded to the leadframe and over-moulded and FIG. 2b illustrates DIL packages on a leadframe after over-moulding.
Figure 2B:
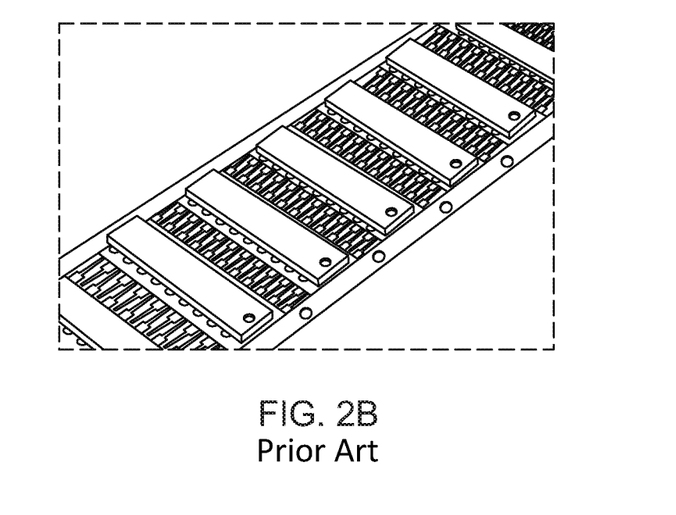

The microelectronics industry has significant expertise developing solutions for extremely high-volume markets. FIG. 1 illustrates a conventional photonic device that is physically coupled to an optical fibre. This embodiment requires costly materials and slow assembly processes, especially the optical fiber alignment and bonding process. Microelectronic devices, such as silicon integrated circuits (ICs), can be assembled in very low-cost packages such as plastic Dual-In-Line (DIL), Quad Flat No-Leads (QFN) or Ball Grid Array (BGA) packages. These can be mass produced and have form-factors that are compatible with Printed Circuit Board (PCB) assembly processes. For example, DIL packages can be produced by over-moulding of lead frame on which the electronic ICs have been pre-assembled. FIG. 2a illustrates a cross-section of an example electronic IC package showing how silicon IC is bonded to the leadframe and over-moulded. FIG. 2b DIL packages on leadframe after over-moulding.

However, these electronic IC packages in their current form are unsuitable for use in photonic packaging. A critical challenge is the ability to couple light in and out of the photonic device. One approach to make use of the package type is to bond the optical fiber to the photonic device before over-moulding. However, this is still a slow process, exactly similar to the process used in current expensive packages, for example using a butterfly package. Therefore, the optimum process requires elimination of the fiber bonding to the photonic device. The invention provides a photonic package system to achieve this assembly process, enabling an effective low-cost and high-volume packaging process.

FIGS. 3 to 6 illustrates a number of embodiments showing how micro optics enable a package design which avoids the need to bond the fiber to the photonic device. Micro optics produce an 'expanded beam' which results significantly relaxed alignment tolerances between the optical fiber and photonic device (on the order of 10 times relaxation of alignment).

Figure 3A:
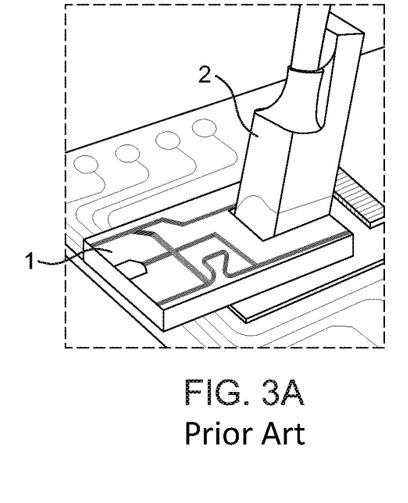
FIG. 3a illustrates a prior art arrangement where an optical fiber is bonded to silicon photonic device.
Figure 3B:
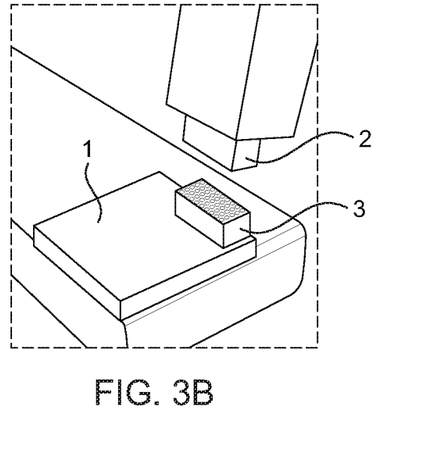
FIG. 3b illustrates how a micro optic device positioned on a silicon photonic device enables an off-chip fiber connection.
Figure 4A:
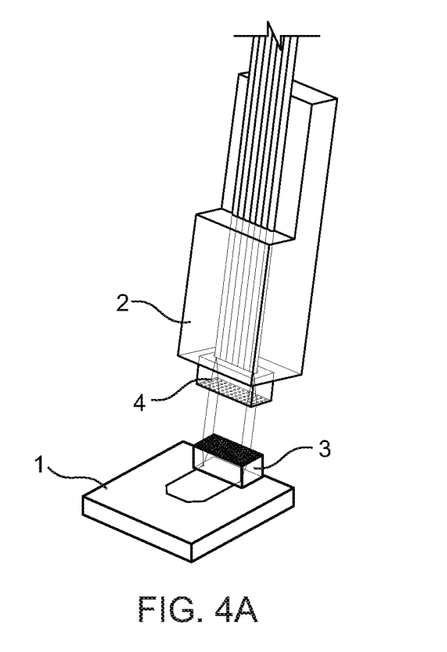
FIG. 4a is a schematic of an optical fiber coupling to a silicon photonic device using micro optics.
Figure 4B:
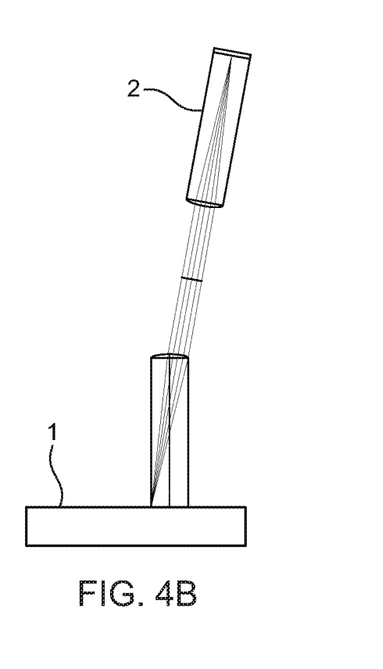
FIG. 4b is a side-view of an optical coupling process.

FIG. 3a illustrates a prior art arrangement where an optical fiber 2 is bonded to silicon photonic device 1. FIG. 3b illustrates how a micro optic device 3 positioned on a silicon photonic device 1 enables an off-chip fiber connection, i.e. no physical connection is required. FIG. 4a is a schematic of an optical fiber 2 coupling to a silicon photonic device 1 using micro optics 3. FIG. 4b is a side-view of an optical coupling process.

Figure 5A:
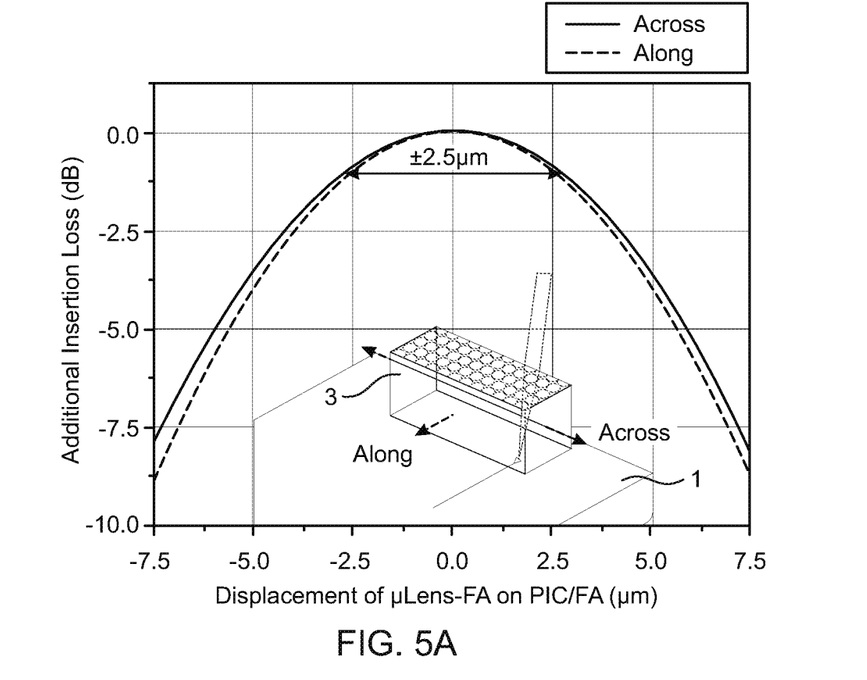
FIG. 5a is experimental data showing tolerance of micro lens alignment to a photonic device.
Figure 5B:
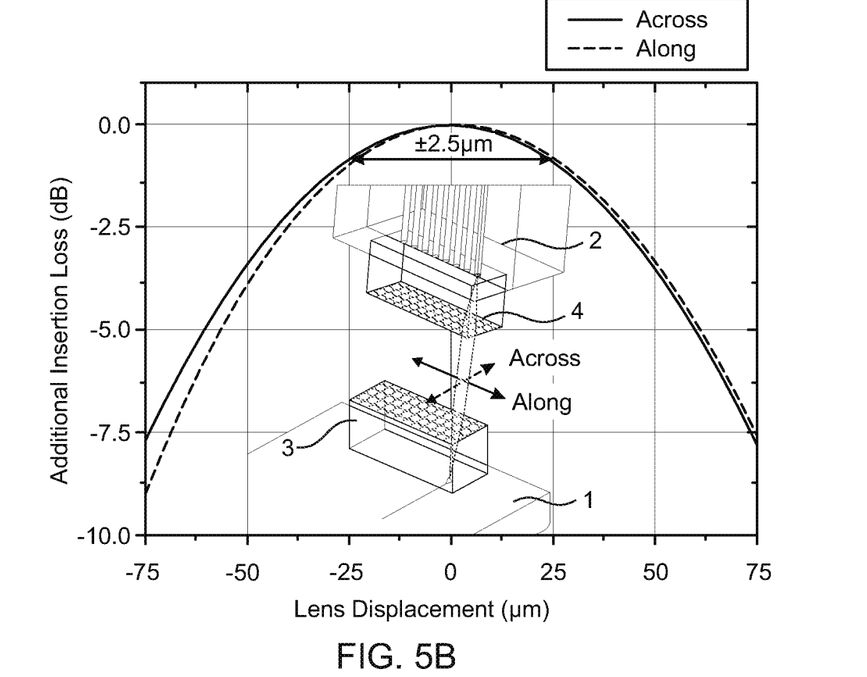
FIG. 5b is experimental data showing tolerance of a micro lens coupled with a photonic device to a micro lens coupled with an optical fiber.

FIG. 5a is experimental data showing tolerance of micro lens alignment to a photonic device. FIG. 5b is experimental data showing tolerance of a micro lens 3 coupled to a photonic device 1 and a second micro lens 4 coupled to a optical fiber 1.

Figure 6:
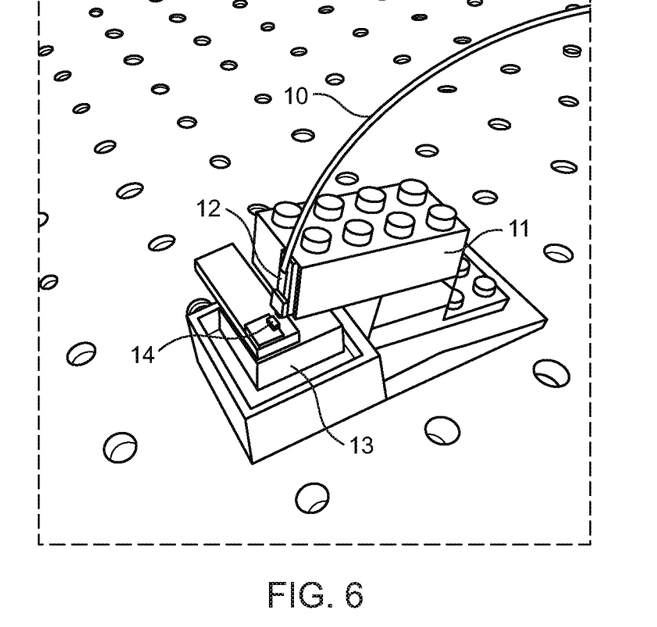
FIG. 6 illustrates an experimental system showing a non-bonded fiber coupling using micro optics, according to one embodiment of the invention.

FIG. 6 is a demonstration system showing non-bonded fiber 10 coupling using micro optics. The block Lego part 11 is used to form a pluggable optical connector 12. Pins on a lower Lego block 13 are used to accurately locate the optical fiber 10 directly over the micro optics 14 to achieve maximum light coupling efficiency.

Figure 7:
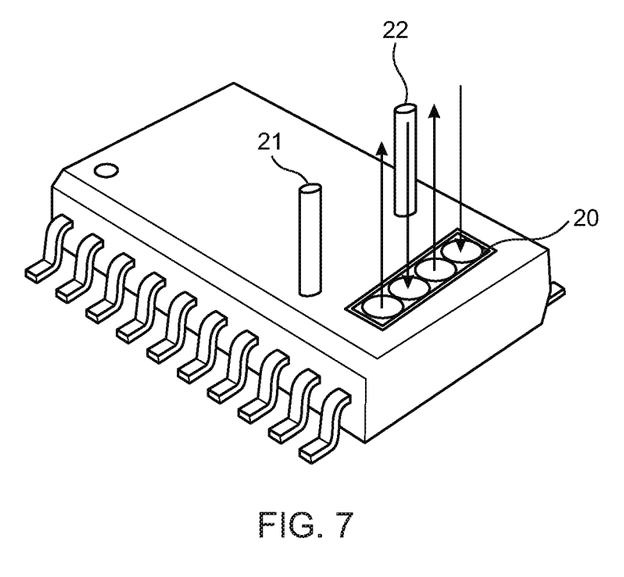
FIG. 7 illustrates a package solution incorporating a micro optic device and location pins shown after encapsulation to enable accurate alignment of the optical fiber connector with respect to the micro optics, according to one embodiment of the invention.

FIG. 7 illustrates a photonic integrated circuit package solution incorporating an optic device 20 and two location pins 21, 22 to enable accurate alignment of the optical fiber connector with respect to the micro optics 20 according to a preferred embodiment of the invention. It will be appreciated that the pins are shown protruding in a substantially vertical direction to the substrate it is possible that the pins can be positioned in a horizontal or angled position to the substrate surface. The fiber location pins 21, 22 can be part of the leadframe assembly 23, as shown in FIG. 8.

An important part of achieving the invention is to have an alignment structure in the photonic package where the off-chip fiber can be aligned to the on-chip micro-optics 20. The design only requires a relaxed alignment due to the expanded beam as shown in FIG. 5b. A key feature of the invention is the addition of alignment structures or pins 21, 22 within the package, in this particular case, the package is a SMT package—such as a QFN or a BGA package. When combined with the use of micro optics it enables a 'fiberless' photonic package to be achieved.

Figure 8:
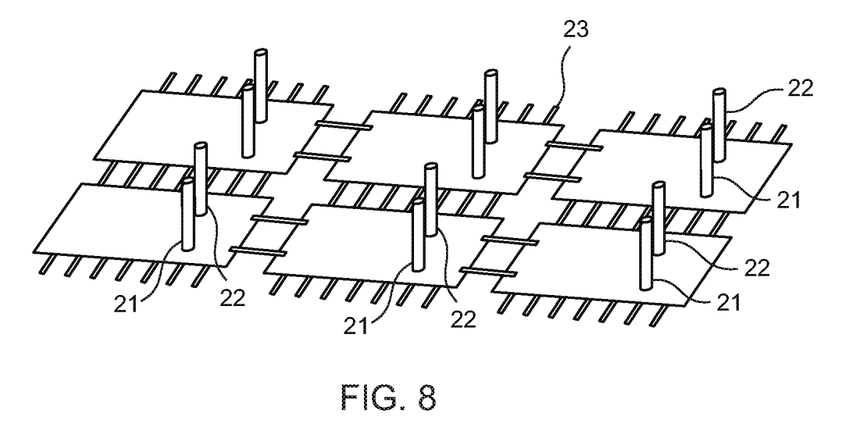
FIG. 8 illustrates an embodiment showing fiber optic location pins as part of the leadframe.
Figure 9:
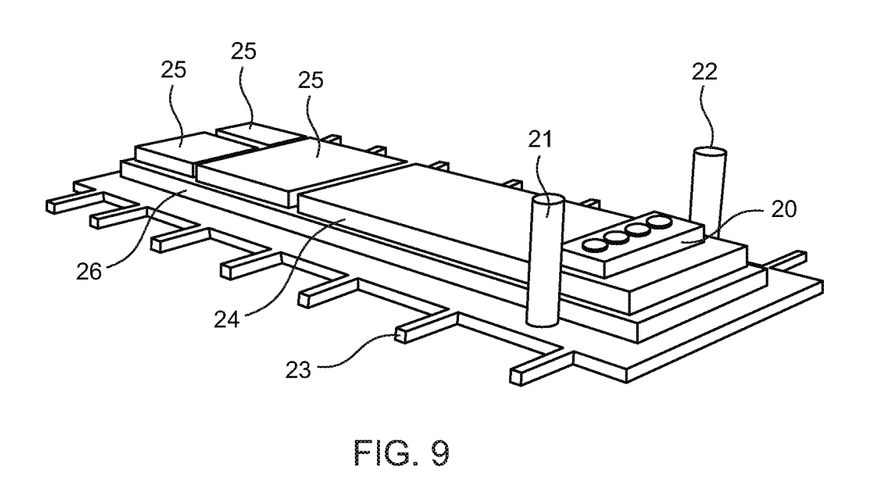
FIG. 9 illustrates a schematic showing micro optics, photonic and electronic devices assembled on a substrate layer.

As shown in FIGS. 7 and 8 these alignment structures or pins 21, 22 can be manufactured during fabrication of the leadframe or substrate. The tolerances required are relaxed, as shown in FIG. 5b. The optical sub-assembly comprises a photonic device 24 and an optical device 20, such as a micro lens, which are aligned or registered to these alignment pins during the assembly process, as shown in FIG. 9. The micro lens 20 is in effect an optical receiver/transmitter that receives an optical signal from an optical source, such as an optical fibre. On the leadframe 3 a substrate layer, such as a ceramic layer, 26 is positioned. On top of the layer 26 are placed a number of electronic devices 25 and the photonic device 24 which is coupled to the micro optics 20. This assembly can be then encapsulated using over-moulding or a soft polymer such as Silicone encapsulation 27, as illustrated in FIGS. 10, 11 and 12.

Figure 11:
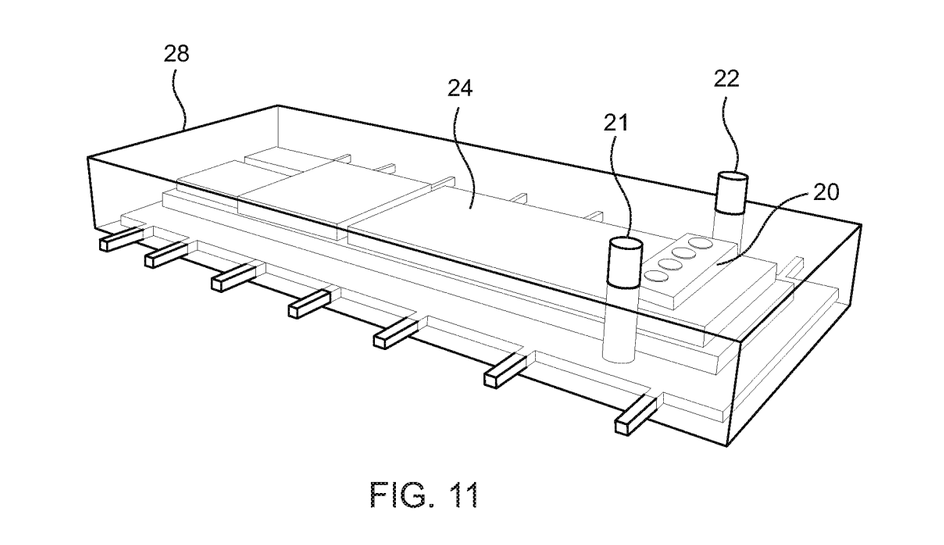
FIG. 11 illustrates a schematic showing a clear or transparent silicone encapsulated package with the optical fiber alignment pins protruding from the moulded package.
Figure 12:
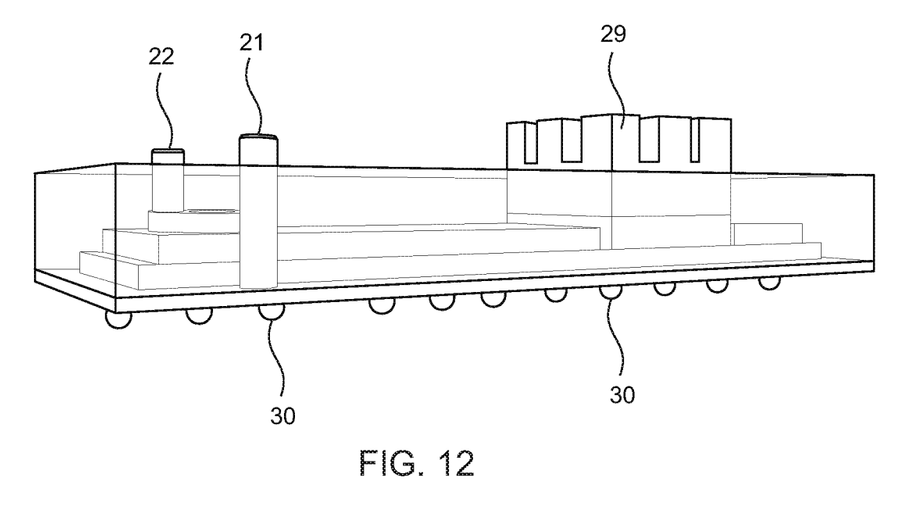
FIG. 12 illustrates a schematic showing a clear or transparent silicone encapsulated package with the optical fiber alignment pins and a heat sink device protruding from the package.

Furthermore, as shown in FIG. 11, if a high index or transparent material 28 is used to form the lens (for example Silicon or high index glass), the silicone can fully encapsulate the complete assembly, thus providing a full hermetic encapsulation seal. Silicone is a material of choice for encapsulation as it has stable mechanical and optical properties at high temperatures which makes it compatible for package solder reflow processes (for example 260 Celsius), enabling the photonic package to be assembled on printed circuit boards. The encapsulant can also be to selected to increase heat dissipation within the package, as opposed to an air-filled cavity which exhibits poor heat dissipation.

In more detail FIG. 9 illustrates a schematic showing micro optics 20, photonic 24 and electronic 25 devices assembled on a ceramic carrier or substrate 26. The ceramic carrier layer 26 is aligned on a metal leadframe with respect to the optical fiber alignment pins 21, 22. This positioning ensures the micro optics 20 are located to maximise light coupling in and out of the photonic device 24.

Figure 10:
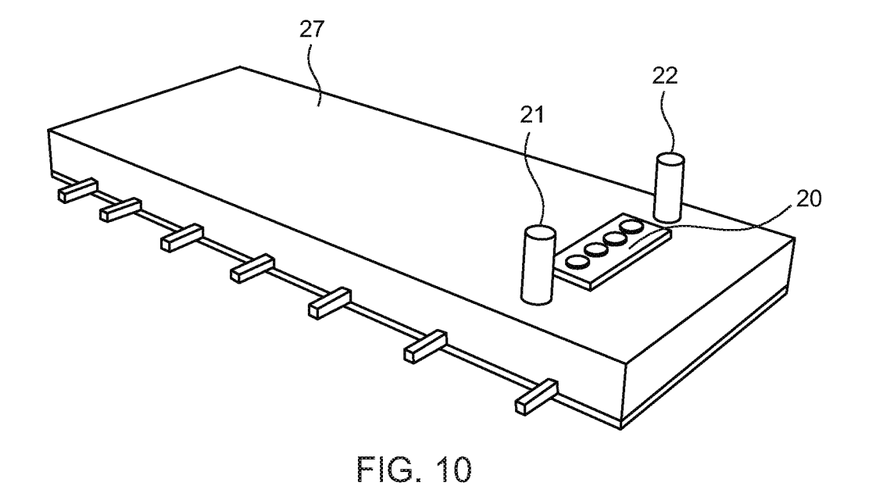
FIG. 10 illustrates a schematic showing over moulded plastic package with the micro optics and optical fiber alignment pins protruding from the moulded package.

FIG. 10 illustrates a schematic showing over moulded plastic package 27 with the micro optics 20 and optical fiber alignment pins 21, 22 protruding from the moulded package which are visible in use. The pins are adapted pins be adapted to physically cooperate with the fibre optic end or block and act as a further guide/connection. For example, the micro optics 4 at the fibre end as shown in FIG. 5b can comprise two female portions or slots dimensioned to receive the pins 21 and 22 in a complementary fashion to physically secure and/or guide the fibre end to the package system. The pins 21, 22 can fit in a snap fit fashion or other suitable fastening mechanism.

FIG. 11 illustrates a schematic showing a clear or transparent silicone encapsulated package 28 with the optical fiber alignment pins 21, 22 protruding from the moulded package. In this embodiment, the micro optics can be wholly encapsulated by the silicone epoxy as it a clear material. In order to maintain optical refraction, a high index lens should be used (for example silicon micro optics). FIG. 12 illustrates a schematic showing clear silicone encapsulated package with the optical fiber alignment pins 21 22 protruding from the moulded package. The package style is style is Ball Grid Array (BGA) 30 on a ceramic or organic PCB substrate. In this embodiment, the micro optics can optionally be encapsulated by the silicone epoxy as it a clear material. In order to maintain optical refraction, a high index lens can be used (eg. silicon micro optics). A heat sink 29 can be incorporated in the design to improve thermal performance.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

What is claimed is:

1. A photonic package system comprising:
   a substrate layer;
   at least two optical alignment pins integrated on the substrate layer and protruding from the substrate layer;
   a photonic device positioned and aligned with respect to the at least two optical alignment pins; and
   an optical device configured to receive an optical signal and is aligned with respect to the at least two optical alignment pins;
     wherein the optical device comprises at least one micro optical lens directly connected to the photonic device, such that the at least one micro optical lens is directly placed on the photonic device and configured with a function of expanding an optical beam-width between the photonic device and an external separate optical fiber source,
     wherein the external separate optical fiber source comprises an optical fiber connector with at least one second optical micro lens,
     wherein the at least one micro optical lens is directly placed on the photonic device to achieve relaxed alignment tolerances between the external separate optical fiber source and the photonic device to maximize light coupling in and out of the photonic device to the external separate optical fiber source; and
   an encapsulation material that encapsulates one or more of the substrate layer and the photonic device.

2. The photonic system of claim 1 wherein said encapsulation material comprises a silicone or soft polymer encapsulation material that encapsulates the substrate layer and the photonic device.

3. The photonic system of claim 1 wherein said encapsulation material comprises a protective encapsulation material that encapsulates the substrate layer and the photonic device, such that the optical device and the at least two optical alignment pins are visible.

4. The photonic system of claim 1 wherein the external separate optical fiber source comprises two female portions or slots dimensioned to receive the at least two optical alignment pins in use.

5. The photonic system of claim 1 wherein the at least two optical alignment pins protrude in a vertical position from the substrate layer.

6. The photonic system of claim 1 wherein the at least two optical alignment pins protrude in a horizontal or angled position with respect to the substrate layer.

7. The photonic system of claim 1 wherein the substrate layer comprises at least one of a metal, ceramic, silicon or organic PCB material.

8. The photonic system of claim 1 wherein said encapsulation material comprises a plastic over-molding configured to provide a hermetic encapsulation that encapsulates the substrate layer, the photonic device and the optical device.

9. The photonic system of claim 1 further comprising an integrated heat sink.

10. The photonic system of claim 1 wherein the at least one micro optical lens comprises at least one high index micro optical lens.

11. The photonic system of claim 10 wherein the encapsulation material comprises a clear silicone epoxy that fully encapsulates the substrate layer, the photonic device and the at least one high index micro optical lens to maintain optical refraction, and wherein the at least two optical alignment pins protrude out from the clear silicone epoxy.

12. A photonic package system comprising:
a substrate layer;
at least two optical alignment pins integrated on the substrate layer and protruding from the substrate layer;
a photonic device positioned and aligned with respect to the at least two optical alignment pins; and
an optical device configured to receive an optical signal and is aligned with respect to the at least two optical alignment pins;
  wherein the optical device comprises at least one high index micro optical lens directly connected to the photonic device, such that the at least one high index micro optical lens is directly placed on the photonic device and configured with a function of expanding an optical beam-width between the photonic device and an external separate optical fiber source,
  wherein the external separate optical fiber source comprises an optical fiber connector with at least one second optical micro lens, and
  wherein the at least one high index micro optical lens is directly placed on the photonic device to achieve relaxed alignment tolerances between the external separate optical fiber source and the photonic device to maximize light coupling in and out of the photonic device to the external separate optical fiber source; and,
an encapsulation material that comprises a clear silicone epoxy that fully encapsulates the substrate layer, the photonic device and the at least one high index micro optical lens to maintain optical refraction,
wherein the at least two optical alignment pins protrude out from the clear silicone epoxy.

\* \* \* \* \*